United States Patent
Ueno

(10) Patent No.: US 7,821,135 B2
(45) Date of Patent: Oct. 26, 2010

(54) SEMICONDUCTOR DEVICE WITH IMPROVED STRESS MIGRATION RESISTANCE AND MANUFACTURING PROCESS THEREFOR

(75) Inventor: Kazuyoshi Ueno, Kanagawa (JP)

(73) Assignee: NEC Electronics Corporation (JP)

( * ) Notice: Subject to any disclaimer, the term of this patent is extended or adjusted under 35 U.S.C. 154(b) by 1086 days.

(21) Appl. No.: 11/124,804

(22) Filed: May 9, 2005

(65) Prior Publication Data

US 2005/0196959 A1 Sep. 8, 2005

Related U.S. Application Data

(63) Continuation of application No. 10/423,077, filed on Apr. 25, 2003, now abandoned.

(30) Foreign Application Priority Data

Apr. 26, 2002 (JP) .............................. 2002-127702

(51) Int. Cl.
*H01L 23/48* (2006.01)
(52) U.S. Cl. .............................. 257/762; 257/E23.145; 257/E23.024; 257/E23.161; 257/668; 257/774; 257/680; 257/766; 257/763; 257/700; 257/701; 257/758; 257/751; 257/752
(58) Field of Classification Search ................. 257/774, 257/680, E23.024, 762, 766, 763, 700, 701, 257/758, 668, 751, 752, E23.161, E23.145, 257/E21.174, E21.175, E21.479, E21.576, 257/E21.585; 438/643, 687
See application file for complete search history.

(56) References Cited

U.S. PATENT DOCUMENTS

| | | | |
|---|---|---|---|
| 4,745,094 A | 5/1988 | Belloni Cofler et al. ........ 502/5 |
| 5,255,258 A * | 10/1993 | Kawade et al. .............. 369/126 |
| 5,922,537 A * | 7/1999 | Ewart et al. .................... 435/6 |
| 5,925,577 A * | 7/1999 | Solis .......................... 438/725 |
| 6,016,355 A | 1/2000 | Dickinson et al. ........... 382/124 |
| 6,100,194 A | 8/2000 | Chan et al. ................... 438/686 |
| 6,104,062 A * | 8/2000 | Zeng .......................... 257/341 |
| 6,143,116 A * | 11/2000 | Hayashi et al. ............. 156/233 |
| 6,159,620 A * | 12/2000 | Heath et al. ................. 428/615 |
| 6,159,846 A * | 12/2000 | Yoo .......................... 438/652 |
| 6,181,012 B1 | 1/2001 | Edelstein et al. ............ 257/762 |
| 6,291,082 B1 | 9/2001 | Lopatin ..................... 428/621 |

(Continued)

FOREIGN PATENT DOCUMENTS

CN 1320960 11/2001

(Continued)

OTHER PUBLICATIONS

Chinese Official Action dated Jun. 13, 2008.

*Primary Examiner*—Alexander O Williams
(74) *Attorney, Agent, or Firm*—Hayes Soloway P.C.

(57) ABSTRACT

A semiconductor device of improved stress-migration resistance and reliability includes an insulating film having formed therein a lower interconnection consisting of a barrier metal film and a copper-silver alloy film, on which is then formed an interlayer insulating film. In the interlayer insulating film is formed an upper interconnection consisting of a barrier metal film and a copper-silver alloy film. The lower and the upper interconnections are made of a copper-silver alloy which contains silver in an amount more than a solid solution limit of silver to copper.

16 Claims, 14 Drawing Sheets

U.S. PATENT DOCUMENTS

| | | | |
|---|---|---|---|
| 6,399,496 B1 * | 6/2002 | Edelstein et al. | 438/687 |
| 6,521,532 B1 | 2/2003 | Cunningham | 438/687 |
| 6,717,189 B2 * | 4/2004 | Inoue et al. | 257/200 |
| 6,818,991 B1 * | 11/2004 | Kikuta | 257/751 |
| 7,259,095 B2 * | 8/2007 | Ueno | 438/686 |
| 7,332,813 B2 * | 2/2008 | Ueno | 257/762 |
| 2002/0024142 A1 | 2/2002 | Sekiguchi | 257/758 |
| 2003/0015793 A1 | 1/2003 | Merchant et al. | 257/734 |
| 2003/0024733 A1 * | 2/2003 | Aoyama et al. | 174/260 |
| 2003/0217828 A1 * | 11/2003 | Opoku-Adusei et al. | 164/98 |
| 2004/0188503 A1 * | 9/2004 | Hua | 228/254 |
| 2005/0029670 A1 * | 2/2005 | Doan | 257/774 |
| 2005/0218517 A1 * | 10/2005 | Capote et al. | 257/738 |
| 2006/0000808 A1 * | 1/2006 | Seki et al. | 216/88 |
| 2006/0286797 A1 * | 12/2006 | Zhang et al. | 438/659 |
| 2007/0042549 A1 * | 2/2007 | Zeng | 438/268 |
| 2008/0066779 A1 * | 3/2008 | Aoki et al. | 134/4 |

FOREIGN PATENT DOCUMENTS

| | | | |
|---|---|---|---|
| EP | 1 148 548 | 10/2001 | |
| JP | 02-143429 | 6/1990 | |
| JP | 05102156 | 4/1993 | 438/680 |
| JP | 07-122556 | 5/1995 | |
| JP | 11-204524 | 7/1999 | |
| JP | 11204524 | 7/1999 | |
| JP | 11-340229 | 12/1999 | |
| JP | 2000-269214 | 9/2000 | |
| JP | 2000-349085 | 12/2000 | |
| JP | 2001-144128 | 5/2001 | |
| JP | 2001-189287 | 7/2001 | |
| JP | 2002-75995 | 3/2002 | |

* cited by examiner

SEMICONDUCTOR DEVICE WITH IMPROVED STRESS MIGRATION RESISTANCE AND MANUFACTURING PROCESS THEREFOR

CROSS REFERENCE TO RELATED APPLICATION

This application is a continuation of U.S. application Ser. No. 10/423,077, filed Apr. 25, 2003, now abandoned.

This application is based on Japanese patent application NO. 2002-127702, the content of which is incorporated hereinto by reference.

BACKGROUND OF THE INVENTION

1. Field of the Invention

This invention relates to a semiconductor device comprising a silver-containing metal region and a process for manufacturing the device.

2. Description of the Prior Art

Recent increasing integration of a semiconductor device has required the use of copper as a material for an interconnection or plug. Copper has advantageous properties of a lower resistance and higher electromigration resistance compared with aluminum which has been conventionally used.

However, as a device has become more compact, electromigration has been significant in such an interconnection using copper. A copper film as a copper interconnection is usually formed by plating, which gives the copper film as an aggregate of a number of polycrystalline copper grains. When a voltage is applied to a copper interconnection having such a structure, mass transfer occurs via a copper grain boundary, leading to electromigration. In a narrower interconnection, a copper grain size is smaller and thus the problem of migration due to mass transfer via such a grain boundary becomes more significant.

For solving such a problem of electromigration (hereinafter, referred to as "EM"), there have been several attempts where silver is added to a copper interconnection.

Japanese Laid-open Patent Publication 2000-349085 has disclosed an interconnection made of a silver-containing copper alloy, and described that the interconnection has a silver content within a range of at least 0.1 wt % to less than its maximum solid solution limit, and if more than the maximum solid solution limit, the metal may form a compound with Cu, leading to a rupture or crack in the interconnection.

Japanese Laid-open Patent Publication 1999-204524 has disclosed an interconnection made of a silver-containing copper alloy and described that a silver content in the interconnection is preferably 1 wt % or less and illustrates forming an interconnection made of a copper alloy containing silver at 0.1 wt % as a specific example.

Some other attempts using a silver-containing copper interconnection have been made for minimizing electromigration and all of these studies have concluded that in the light of the purpose, a silver content is within its solid solution limit in a copper film and thus at most 1 wt %. There have been developed no methods for consistently forming an alloy containing silver and copper with a silver content higher than the above limit and thus there have been little information about the physical properties of such an alloy film and its effects on device performance when applied in a semiconductor device.

Meanwhile, stress migration in a copper interconnection has become a significant problem. FIG. 2 shows a schematic cross section of a copper multilayer interconnection formed by a damascene method, where an upper interconnection 121b is connected with a lower interconnection 121a and the upper interconnection 121b consists of a connecting plug and an interconnection formed thereon. In FIG. 2(a), a void 122 is formed on the side of the upper interconnection 121b. That is the void is formed in a via region in the upper interconnection 121b. In FIG. 2(b), a void 122 is formed on the upper surface of the lower interconnection 121a. Such a void 122 may be caused by an internal stress generated in the copper interconnection due to, for example, a heat history during a semiconductor process. In FIG. 2(a), the void 122 may be formed by upward migration of copper in the via due to copper "pull-up" in the upper interconnection 121b. In FIG. 2(b), copper may horizontally migrate in the lower interconnection 121a, leading to formation of the void 122.

Our studies have demonstrated that such a void-forming phenomenon prominently occurs about at 150° C. which is a practical process temperature for a semiconductor device (for example, in a bonding process and a photoresist baking process). A void thus formed may cause connection defect between a connecting plug and an interconnection, a reduced yield of a semiconductor device and instability in a semiconductor device after a long period use.

For preventing generation of such stress migration, besides investigating processes, a material itself for a metal region such as an interconnection must be studied besides process investigation.

Furthermore, the recent needs for much higher level of device operation require developing a material for an interconnection exhibiting higher-speed operability than a copper interconnection.

SUMMARY OF THE INVENTION

In view of these problems, an objective of this invention is to improve stress migration resistance in a semiconductor device comprising a metal region, and thus to improve reliability of the device.

Another objective of this invention is to provide a process for consistently manufacturing such a semiconductor device.

This invention provides a semiconductor device comprising a metal region on a semiconductor substrate, wherein a silver content is more than 1 wt % to the total amount of component metals in the metal region.

This invention also provides on a semiconductor device comprising a metal region on a semiconductor substrate, wherein the metal region comprises copper and silver; and a silver content to the total amount of component metals in the metal region is more than a solid solution limit of silver to copper.

The metal region in the above semiconductor device a larger amount of silver than that in a conventional interconnection structure made of a copper-silver alloy, and thus can effectively prevent stress migration when being exposed to a heat history during, for example, a process for manufacturing a semiconductor.

This invention also provides a semiconductor device comprising a metal region on a semiconductor substrate wherein a maximum hysteresis error in a temperature-stress curve in the metal region is 150 MPa or less.

When a semiconductor device is exposed to a heat history, a temperature-stress curve for a metal region generally exhibits different patterns in a warming and a cooling processes. An indicator for the difference is defined as a "maximum hysteresis error". A maximum hysteresis error is the maximum separation width between the curves showing the warming and the cooling processes. For example, in FIGS. 8(a) and (b), the maximum width between a warming process a and a cooling process b is a maximum hysteresis error. In the semiconductor device, an irreversible loss is reduced when being exposed to a heat history during a process for manufacturing a semiconductor, and thus stress migration is effectively prevented.

This invention further provides a semiconductor device comprising a metal region on a semiconductor substrate wherein a recrystallization temperature of a component metal in the metal region is 200° C. or higher. A recrystallization temperature is a temperature at which transformation of crystal grains or grain growth occurs due to atomic diffusion. Since recrystallization may result in a void or distortion in a metal region, a higher recrystallization temperature is an important condition for providing a reliable metal region. The above semiconductor device has a recrystallization temperature higher than 200° C., so that irreversible loss can be minimized when being exposed to a heat history and thus stress migration can be effectively prevented. A recrystallization temperature can be determined by, for example, measuring a hysteresis curve. FIG. 9 shows a method for determining a recrystallization temperature. An inflection point during a warming process, i. e., an intersection between a linear line and a horizontal line after the initiation of temperature-rising corresponds to a recrystallization temperature. In this figure, a recrystallization temperature is 220° C.

In a semiconductor device according to this invention, the metal region may be made of a silver-containing metal with a shape of an interconnection plug or pad.

This invention also provides a process for manufacturing a semiconductor device comprising the steps of forming a metal region on a semiconductor substrate; contacting the surface of the metal region with a silver-containing liquid; and heating the metal region.

According to this process for manufacturing a semiconductor device, contacting the surface of the metal region with a silver-containing liquid results in precipitation of silver and then heating allows silver to diffuse in the metal region. As a result, a silver-containing metal region may be suitably formed. According to this invention, a metal region made of a copper-silver alloy may be consistently formed by a convenient process. Since a plating solution itself does not have to contain silver, the plating solution may be selected more freely.

This invention also provides a process for manufacturing a semiconductor device comprising the steps of contacting a semiconductor substrate or a film formed thereon with a silver-containing solution to precipitate silver; forming a metal region on the precipitated silver; and heating the metal region.

According to the process for manufacturing a semiconductor device, the precipitated silver after contacting with the silver-containing solution diffuses in a metal region formed thereon. As a result, a silver-containing metal region may be suitably formed. According to this invention, a metal region made of a copper-silver alloy may be consistently formed by a convenient process. Furthermore, a metal composition in a metal region may be made homogeneous.

This invention also provides a process for manufacturing a semiconductor device comprising the steps of contacting a device-forming surface of a semiconductor substrate with a silver-containing plating solution; and forming a silver-containing metal region on the semiconductor substrate. The silver-containing plating solution may be contacted with all or a part of the device-forming surface. Specifically, a plating solution is contacted with either of a semiconductor substrate surface, a metal film, an insulating film or a semiconductor film or a surface comprising these in any combination.

Contacting with a silver-containing plating solution may be conducted after forming a plating film using a silver-free plating solution. The process may comprise, for example, the steps of forming a copper film such that it partially fills a concave formed in an insulating film on a semiconductor substrate; then contacting the surface of the copper film with a silver-containing plating solution to form a silver-containing film on the copper film; and then polishing the whole surface of the substrate to leave the copper film and the silver-containing film only in the concave. Alternatively, this process may comprises the steps of forming a silver-containing film; forming a copper film on the silver-containing film; and polishing the substrate surface as described above.

According to this process for manufacturing a semiconductor device, a metal region made of a copper-silver alloy may be consistently formed by a convenient process. A homogeneous metal composition may be provided in the metal region.

In a process for manufacturing a semiconductor device according to this invention, the metal region may contain copper. Furthermore, in a process for manufacturing a semiconductor device according to this invention, a silver content may be more than 1 wt % to the total amount of component metals in the metal region after heating. Thus, a metal region highly resistant to stress migration may be consistently formed.

When a metal region in this invention is made of a copper-silver alloy, other components may be further added. For example, components such as Zr, In, Al, Ti and Sn may be added up to 1 wt % to the total amount of the metals. Zr and/or In may be added to improve adhesiveness between the metal region and an insulating film and/or between the metal region and a barrier metal film. Al, Ti and Sn may diffuse in the surface of the reactive copper-silver alloy film to be bound to the material atoms constituting the interlayer insulating film, resulting in improved adhesiveness.

While some aspects of this invention have been described, variations may be made to these. For example, when this invention is applied to an interconnection structure formed by a damascene process, the effects of this invention become more prominent. There will be described such aspects.

Specifically, a metal region in this invention may be formed by a single or dual damascene process.

A single damascene process comprises the steps of:

(a) forming a first interconnection as a metal film on a semiconductor substrate;

(b) forming a first interlayer insulating film over the whole upper surface of the semiconductor substrate such that it covers the first interconnection;

(c) selectively removing the first interlayer insulating film to form a connecting hole reaching the upper surface of the first interconnection;

(d) forming a barrier metal film coating the inner surface of the connecting hole and then forming a metal film filling the connecting hole;

(e) removing a metal film formed outside the connecting hole;

(f) forming a second interlayer insulating film over the whole surface of the semiconductor substrate such that it covers the metal film formed in the connecting hole;

(g) selectively removing the second interlayer insulating film to form an interconnection groove in whose bottom the metal film formed in the connecting hole is exposed;

(h) forming a barrier metal film coating the inner surface of the interconnection groove and then forming a metal film filling the interconnection groove; and (i) removing the metal film formed outside the interconnection groove to form a second interconnection.

In this process, the first and the second interconnections and the whole connecting hole or a part thereof may be a "metal region" to which a semiconductor device or process according to this invention can be applied. Some of the above steps of (a) to (i) may be omitted as appropriate.

A dual damascene process comprises the steps of:

(a) forming a first interconnection as a metal film on a semiconductor substrate;

(b) forming a first interlayer insulating film over the whole surface of the semiconductor substrate such that it covers the first interconnection;

(c) selectively removing the first interlayer insulating film to form a connecting hole reaching the upper surface of the first interconnection and to form an interconnection groove which is connected to the upper surface of the connecting hole;

(d) forming a barrier metal film coating the inner surfaces of the connecting hole and the interconnection groove and then forming a metal film such that it fills the connecting hole and the interconnection groove; and (e) removing the metal film formed outside the interconnection groove.

In this process, the first and the second interconnections and the whole connecting hole or a part thereof may be a "metal region" to which a semiconductor device or process according to this invention can be applied. Some of the above steps of (a) to (e) may be omitted as appropriate.

The interconnection structure formed by the above damascene process comprises the semiconductor substrate; the first interconnection formed on the semiconductor substrate; the connecting plug connected to the first interconnection; and the second interconnection connected to connecting plug.

In this semiconductor device, the first and the second interconnections and the whole connecting hole or a part thereof may be a "metal region" to which this invention may be applied.

In these drawings, the symbols have the following meanings; 22a is a first interconnection; 22b is a second interconnection; 28 is a connecting plug; 101 is an insulating film; 102 is a barrier metal film; 103 is a copper-silver alloy film; 104 is an interlayer insulating film; 105 is an interconnection groove; 106, 106a and 106b are barrier metal films; 107 is a seed metal film; 108 is a silver-containing film; 110 is a copper plating film; 111 is a copper-silver alloy film; 111a is an interlayer connecting plug; 111b is a copper-silver alloy film; 114 is a copper-silver alloy plating film; 117 is a copper plating film; 121a is a lower interconnection; 121b is an upper interconnection; and 122 is a void.

DETAILED DESCRIPTION OF PREFERRED EMBODIMENTS

Figure 1A:
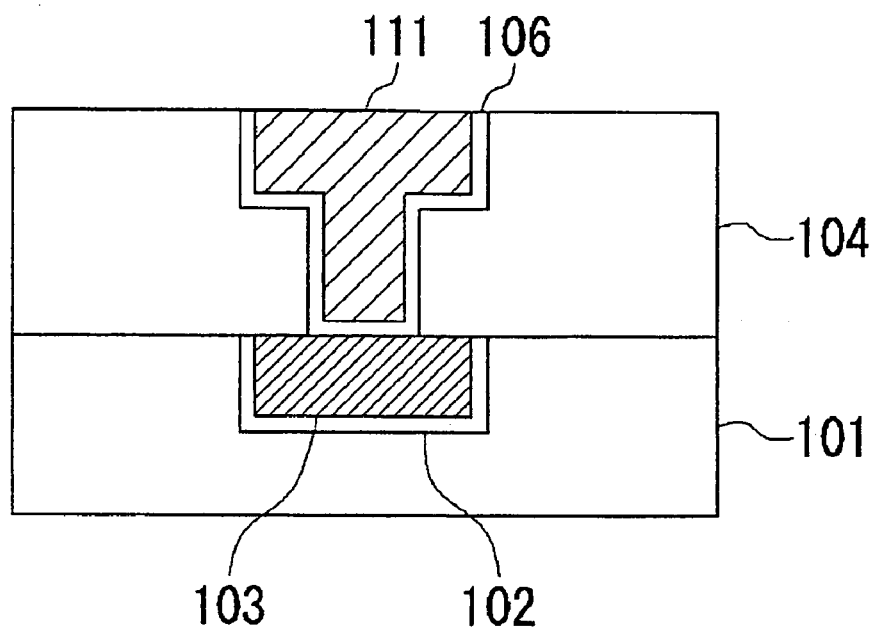
FIGS. 1a-1b show cross sections illustrating an embodiment of a semiconductor device according to this invention.

FIGS. 1(a) and (b) are schematic cross sections illustrating an embodiment of semiconductor device according to this invention. FIG. 1(a) shows an embodiment in which this invention is applied to a copper multilayer interconnection structure formed by a so-called dual damascene process. In an insulating film 101, a lower interconnection is formed, which consists of a barrier metal film 102 and a copper-silver alloy film 103. On the insulating film, there is formed an interlayer insulating film 104, in which an upper interconnection consisting of a barrier metal film 106 and a copper-silver alloy film 111 is formed. The upper interconnection has a T-shaped cross section. The lower part of the T-shape is an interconnection connecting plug while the upper part of the T-shape is an upper interconnection.

The term "alloy" as used herein means a product obtained by melting and coagulating two or more metal elements, and is intended to also include one containing a non-metal or semi-metal element in addition to metal elements. Depending on a mixing style of component elements, an alloy may have a state of a solid solution or intermetallic compound or a mixture thereof. Thus, the term "alloy" as used herein also includes such a product containing a component to its solid solution limit or more.

In the copper-silver alloy film 103 and the copper-silver alloy film 111, a silver content to the whole alloy film may be preferably 1 wt % or more, more preferably 2 wt % or more to more consistently prevent stress migration. The silver content to the whole alloy film is 3 wt % or more may effectively reduce a maximum hysteresis error, resulting in more stable prevention of stress migration. In particular, when this invention is applied to a process for forming metal interconnections with different interconnection widths, a silver content described above may allow a predetermined amount of silver to be consistently introduced in each interconnection, resulting in effective prevention of stress migration. There is not a particular upper limitation to a silver content to the whole alloy film, but in the light of stable formation of a copper-silver alloy film, it may be preferably 99 wt % or less, more preferably 80 wt % or less, further preferably 50 wt % or less. In the light of resistance reduction, a silver content to the whole alloy film is preferably 90 wt % or more, more preferably 95 wt % or more, further preferably 98 wt % or more.

A silver content is preferably more than a solid solution limit of silver to copper. Thus, even when a production process is changed, stress migration may be more consistently prevented. Although the reason is not fully understood, a silver content more than a solid solution limit of silver to copper would considerably reduce influence of hysteresis when the copper-silver alloy is exposed to a heat history. This will be described in Examples.

Figure 16:
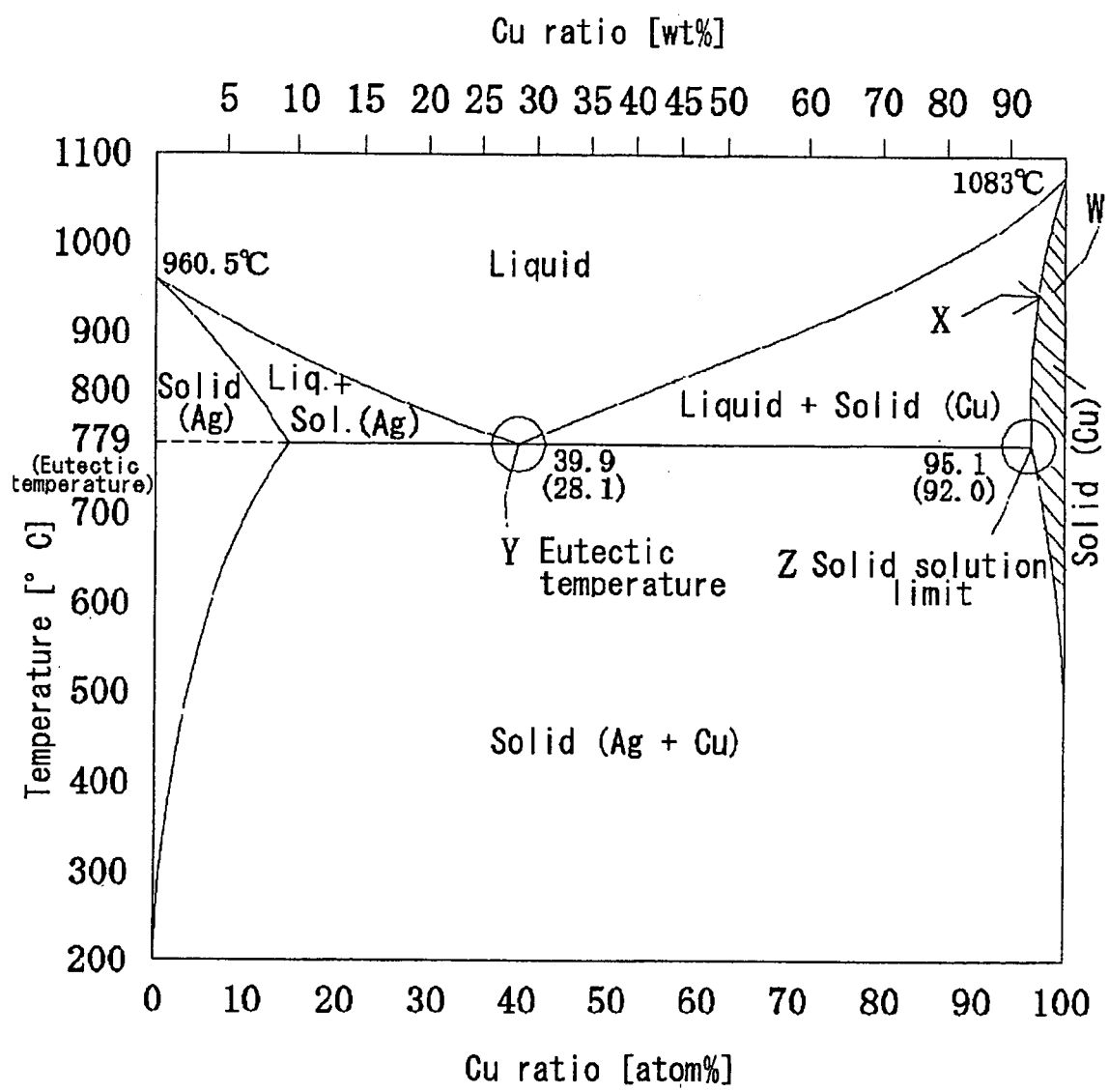
FIG. 16 is a state diagram for an Ag—Cu two-component eutectic compound.

A solid solution limit of silver to copper will be described with reference to FIG. 16. As shown in FIG. 16, an Ag—Cu two-component eutectic compound has an eutectic point Y of 39.9 wt % (converted to a silver wt % to copper), an eutectic temperature of 779° C., and a maximum solid solution limit of Ag to Cu (Z; a point at which a solid solution limit of Ag to Cu is maximum) of 4.9 wt %. In FIG. 16, a solid solution limit is plotted on Curve X at a temperature and the solid solution limit is maximum at Point Z (maximum solid solution limit).

In production of a semiconductor device, a maximum process temperature is about 400° C. at which a solid solution limit is about 1 wt % (converted to an Ag wt % to Cu). In this invention, a silver content to the total amount of component metals in a metal region is preferably more than a solid solution limit of silver to copper. This solid solution limit is preferably a maximum of a solid solution limit within a temperature range of, for example, 0° C. to 400° C.

Figure 1B:
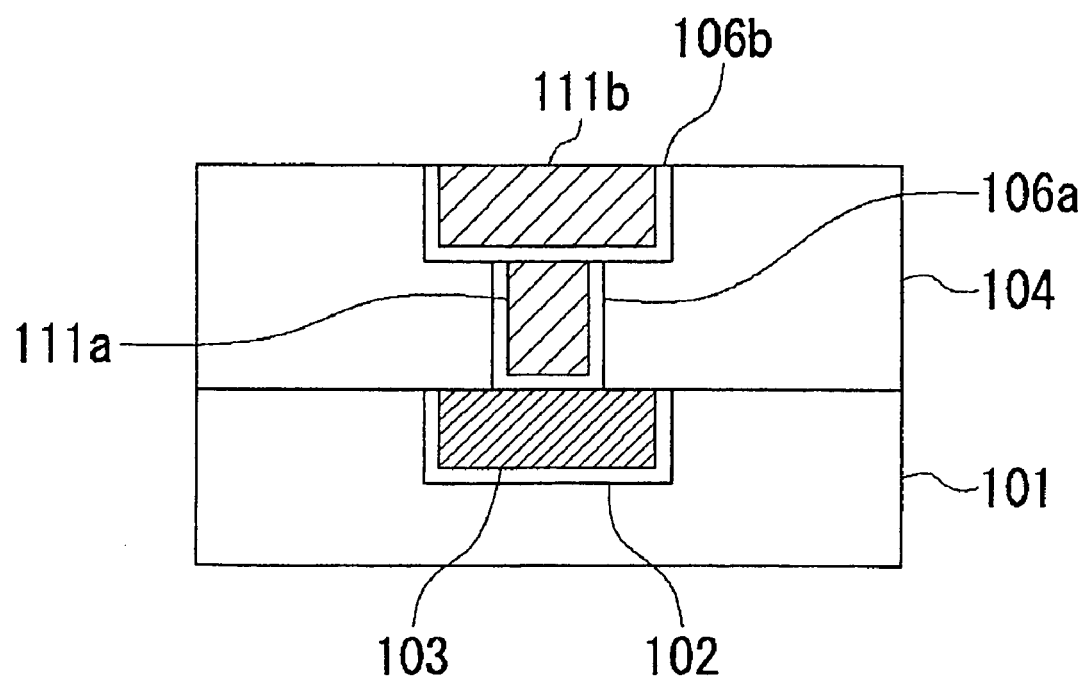
Figure 2A:
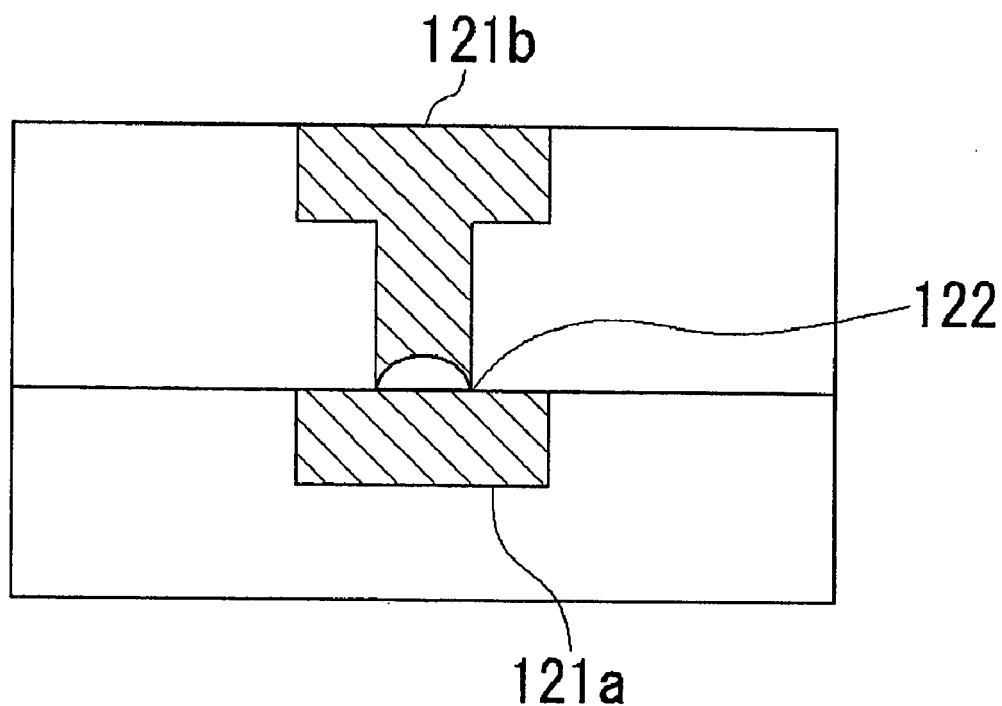
FIGS. 2a-2b show cross sections illustrating an interconnection structure in which a void is formed due to stress migration.
Figure 2B:
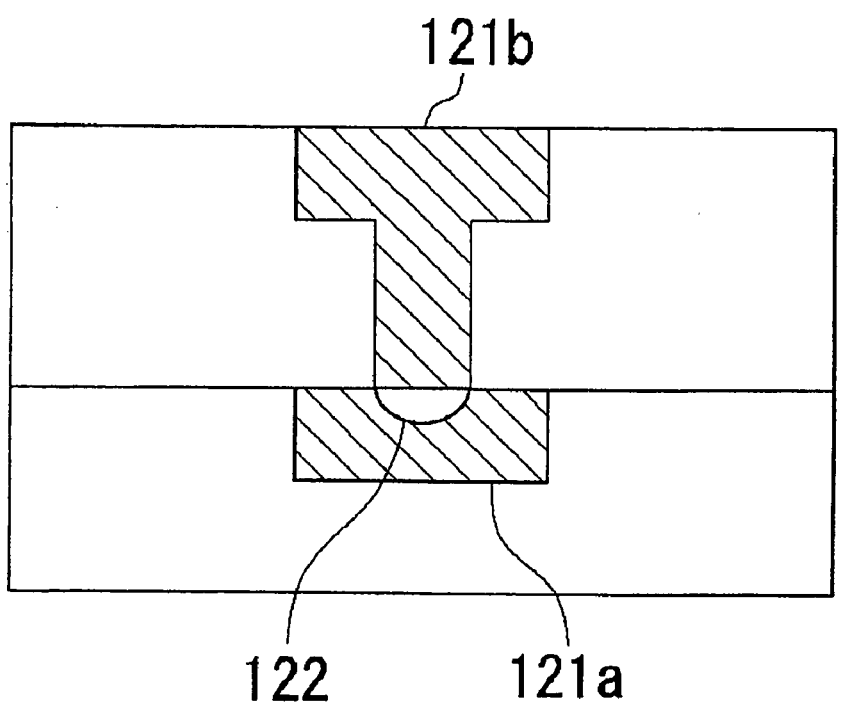

There will be an embodiment in which this invention is applied to an interconnection structure formed by a damascene method. FIG. 1(b) shows an example of application of this invention to a copper multilayer interconnection structure formed by a single damascene method. The structure shown in FIG. 1(a) has an advantage that the number of production steps may be reduced by simultaneously forming an interlayer connecting plug and an interconnection. However, since the interlayer connecting plug and the interconnection are formed as an integrated part, influence of stress migration may become significant, leading to higher tendency to formation of a void in a mode shown in FIG. 2(a). On the other hand, in FIG. 1(b), although the number of production steps increases, the copper-silver alloy film is separated into two parts, i. e., the interlayer connecting plug and the interconnection via an intervening barrier metal film 106b so that stress migration can be much more reduced. In FIG. 1(b), there is formed a lower interconnection consisting of a barrier metal film 102 and a copper-silver alloy film 103 in an insulating film 101. On the insulating film, there is formed an interlayer insulating film 104, in which are formed a via plug consisting of an interlayer connecting plug 111a as a copper-silver alloy and a barrier metal film 106a as well as an upper interconnection consisting of a copper-silver alloy film 111b and a barrier metal film 106b. In the copper-silver alloy film 103, the interlayer connecting plug 111a and the copper-silver alloy film 111b, a silver content to the whole alloy film may be preferably 1 wt % or more, more preferably 2 wt % or more to more consistently prevent stress migration. The silver content to the whole alloy film is 3 wt % or more may effectively reduce a maximum hysteresis error, resulting in more stable prevention of stress migration. In particular, when this invention is applied to a process for forming metal interconnections with different interconnection widths, a silver content described above may allow a predetermined amount of silver to be consistently introduced in each interconnection, resulting in effective prevention of stress migration. There is not a particular upper limitation to a silver content to the whole alloy film, but in the light of stable formation of a copper-silver alloy film, it may be preferably 99 wt % or less, more preferably 80 wt % or less, further preferably 50 wt % or less. A silver content is preferably more than a solid solution limit of silver to copper. Thus, even when a production process is changed, stress migration may be more consistently prevented.

In the interconnection structures in FIGS. 1(a) and (b), the insulating film 101 and the interlayer insulating film 104 may be made of a material selected from polyorganosiloxanes such as HSQ (hydrogensilsesquioxane), MSQ (methylsilsesquioxane) and MHSQ (methylated hydrogensilsesquioxane); aromatic organic materials such as polyaryl ethers (PAEs), divinylsiloxane-bis-benzocyclobutene (BCB) and Silk®; and materials having a low dielectric constant such as SOG (spin on glass), FOX (flowable oxide), Parylene, Saitop and BCB (BenzoCycloButene). An HSQ may have any of various structures such as a so-called ladder type and a cage type. Such an insulating film with a low dielectric constant may be used to minimize problems such as crosstalk, resulting in improved reliability in a device.

The insulating film 101 or the interlayer insulating film 104 is preferably made of a material having a substantially equal coefficient of thermal expansion to that for a component metal of the interconnection. Thus, stress migration can be effectively minimize in the connecting plug and the interconnection. In the light of these conditions, for example, when using a copper/silver-containing metal film as a metal interconnection, an interlayer insulating film is preferably made of HSQ (hydrogensilsesquioxane).

In the interconnection structure shown in FIGS. 1(a) and (b), the barrier metal films 102 and 106 and 106b may contain a high melting metal such as Ti, W and Ta. Examples of a preferable metal for a barrier metal film include Ti, TiN, W, WN, Ta and TaN. Particularly, a tantalum barrier metal in which Ta and TaN are sequentially laminated is preferably used. The barrier metal film may be formed by an appropriate process such as sputtering and CVD. A thickness of the barrier metal film may be appropriately determined depending on some conditions such as the type of a material and an interconnection structure; for example, about 1 to 30 nm.

Though not shown in FIGS. 1(a) and (b), a diffusion barrier may be disposed between the insulating film 101 and the interlayer insulating film 104 as appropriate. The diffusion barrier can prevent a component metal of the interconnection or plug from being diffused in the insulating film. Furthermore, it may play a role of an etching stopper when forming an interlayer connecting hole in a process for forming an interconnection structure. Examples of a metal for the diffusion barrier include SiC, SiCN, SiN, SiOF and SiON.

Figure 7:
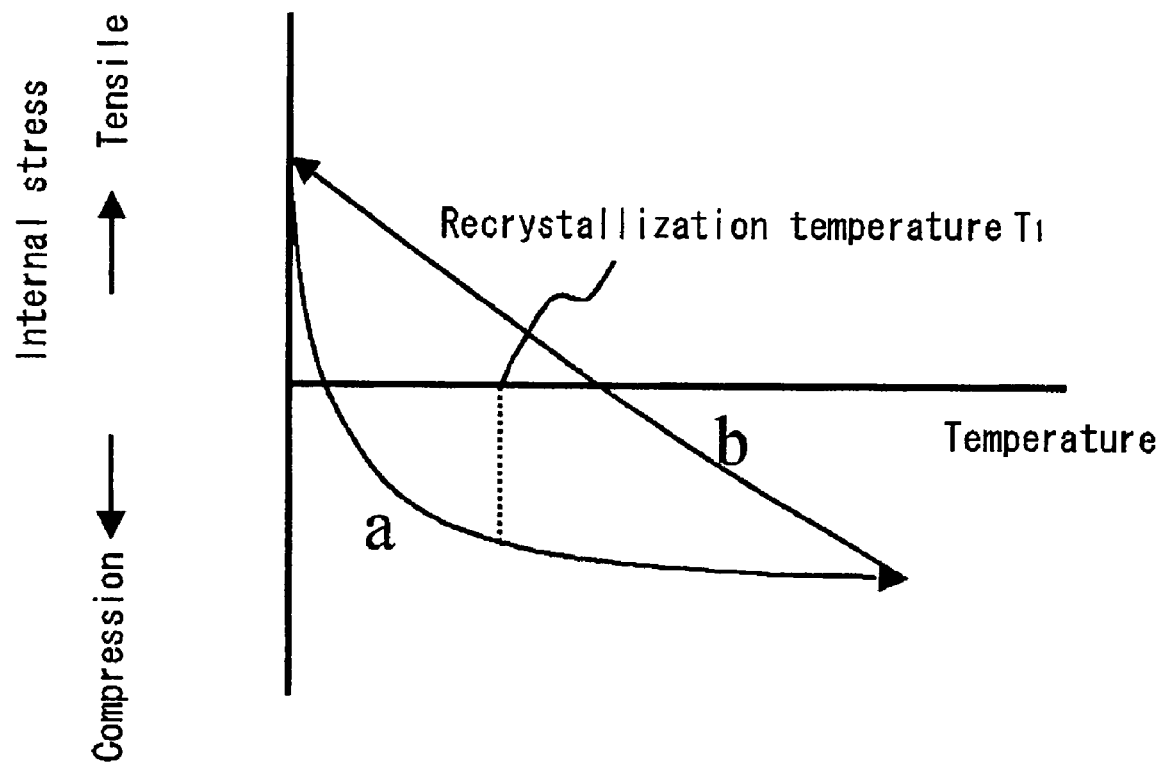
FIG. 7 is a graph showing an example of a hysteresis curve.

There will be then described a component material of a metal region such as an interconnection in this invention. FIG. 7 shows variation in an internal stress when a copper interconnection is exposed to a heat history consisting of a warming and a cooling processes. The horizontal axis is a temperature while the vertical axis is an internal stress in a copper interconnection. As shown in the figure, hysteresis occurs between a warming process (a) and a cooling process (b).

As a temperature rises from room temperature, an internal stress is changed from a tensile mode to a compression mode. Then, when a temperature exceeds a recrystallization temperature $T_1$ for copper, plastic deformation occurs and an internal stress is kept at a relatively constant value (a). Then, as a temperature decreases, an internal stress in the interconnection is changed from a compression mode to a tensile mode and then a cooling process proceeds with a relatively constant tensile stress (b).

As shown in the drawing figures, hysteresis between the warming and the cooling processes causes migration of a component metal in the copper interconnection. That is, a larger hysteresis leads to a larger migration or deformation, which may cause disconnection due to a void which leads to a less reliable device.

Figure 8A:
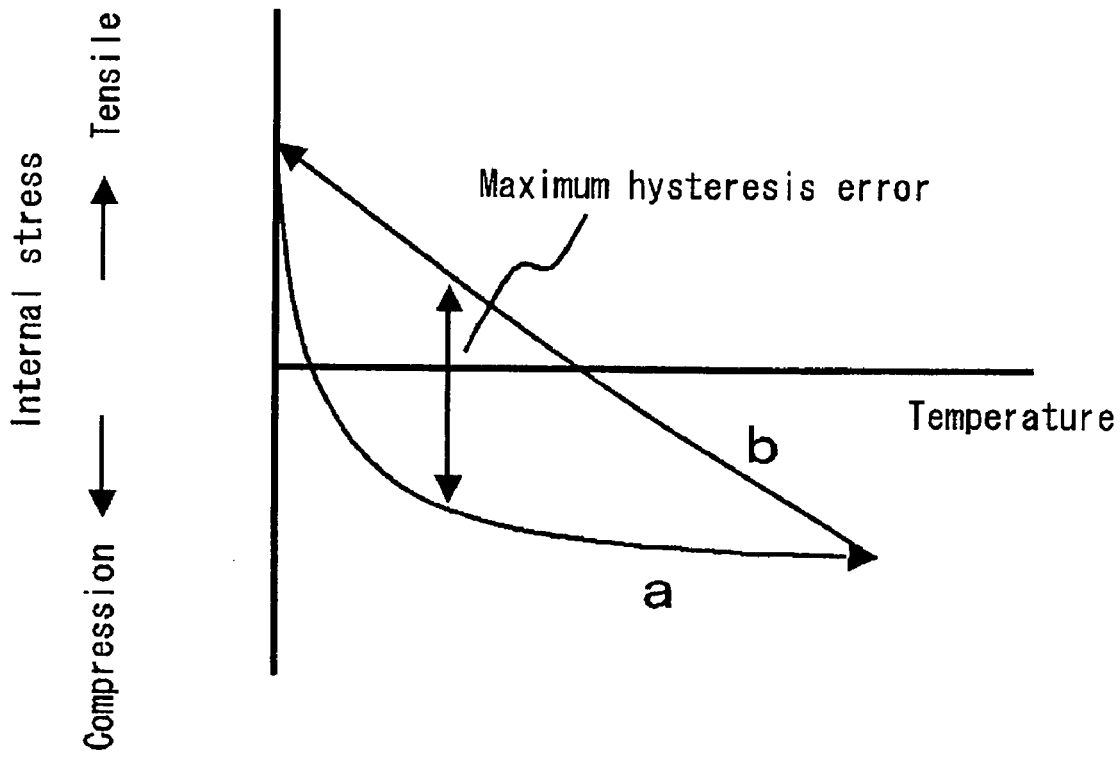
FIG. 8 is a graph showing an example of a hysteresis curve.

In this invention, an interconnection material which can reduce such a hysteresis is selected to provide a reliable interconnection structure. FIGS. 8(a) and (b) schematically show temperature-stress curves when using different interconnection materials. In these figures, a horizontal axis is a temperature while the vertical axis is an internal stress in an interconnection. FIG. 8(a) shows usual behavior of a copper interconnection, while FIG. 8(b) shows behavior of a copper-silver interconnection as a copper-silver alloy film formed according to this invention.

Here, as indicated in FIGS. 8(a) and (b), a maximum width between Processes (a) and (b) is defined as a maximum hysteresis error. An interconnection material defined in this invention may be used to significantly reduce the maximum hysteresis error. A maximum hysteresis error is preferably 150 MPa or less, more preferably 100 MPa or less. Thus, stress migration can be consistently prevented. Furthermore, when a maximum hysteresis error is 80 MPa, stress migration may be effectively prevented even during forming a fine interconnection with a size of about 0.1 μm.

Figure 8B:
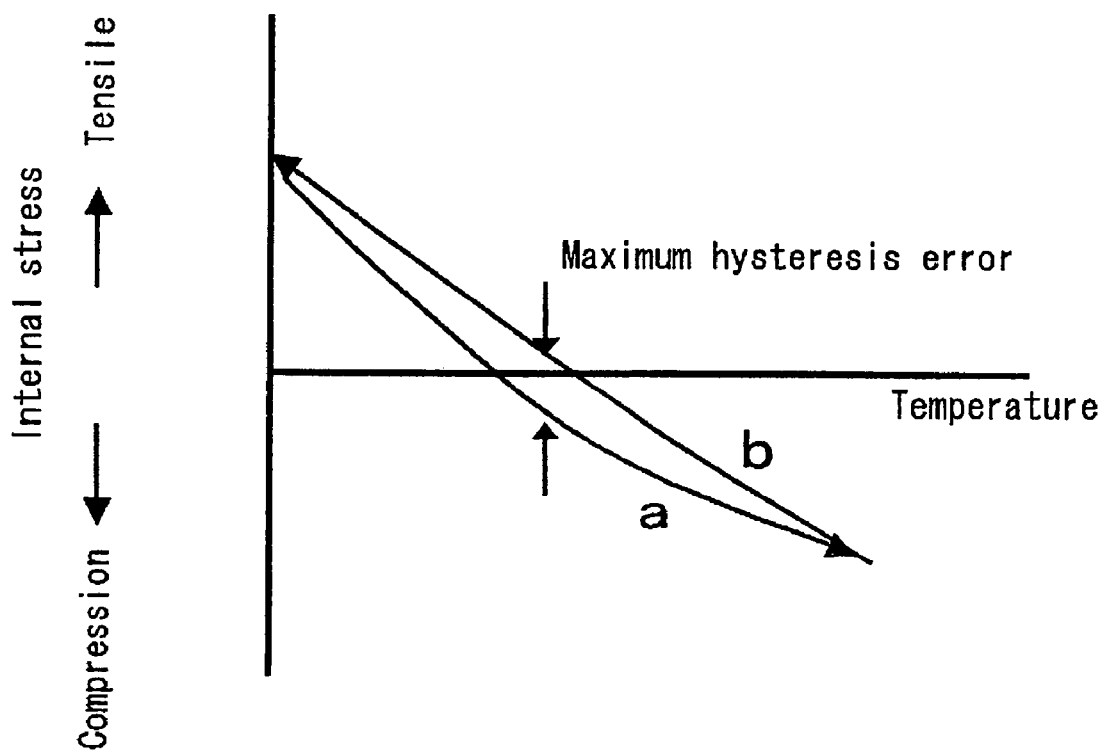
Figure 9:
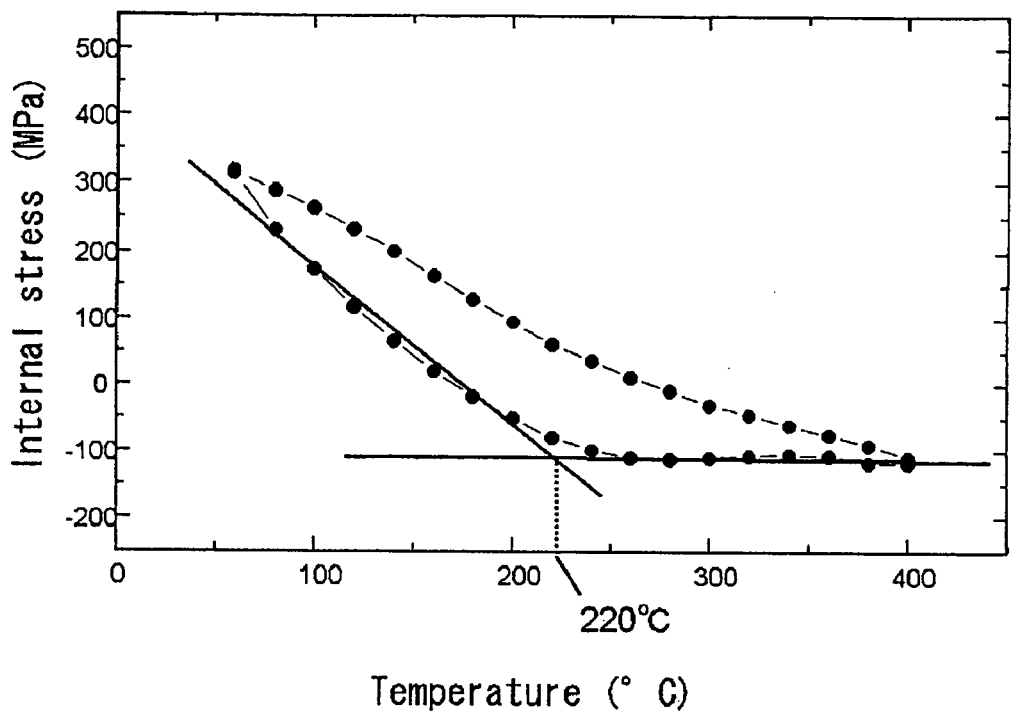
FIG. 9 shows a method for determining a recrystallization temperature.

In FIG. 7, increase in a recrystallization temperature $T_1$ gives a curve as illustrated in FIG. 8(b). It indicates that increase in a recrystallization temperature $T_1$ in a metal region such as an interconnection is effective for reducing a maximum hysteresis error. During a warming process (a), a plateau of a stress value appears in a region in which a temperature is higher than a recrystallization temperature $T_1$, and thus the recrystallization temperature $T_1$ may be increased to reduce the plateau which then leads to a reduced maximum hysteresis error. That is, difference between the maximum of a process temperature (the rightmost point in the hysteresis curve in FIG. 7 or 8(a) and (b) and a recrystallization temperature $T_1$ may be reduced to reduce a maximum hysteresis error. For effectively reducing a maximum hysteresis error, a recrystallization temperature of a metal region such as an interconnection is preferably 200° C. or higher, more preferably 300° C. or higher. Thus, stress migration can be consistently prevented. Since a process temperature for a semiconductor device is usually 400° C. or lower, a recrystallization temperature may be 350° C. or higher to further consistently prevent stress migration during the process.

Some embodiments of this invention will be more specifically described with reference to the drawings.

Embodiment 1

In this embodiment, this invention will be described with reference to FIGS. 3(a)-3(c) in terms of application to a copper interconnection formed by a dual damascene method.

First, on a silicon substrate (not shown) is formed an insulating film 101, on which is then a lower interconnection consisting of a barrier metal film 102 and a copper-silver alloy 103. Here, the lower interconnection can be formed by a procedure described below.

After forming an interlayer insulating film 104 on the insulating film 101, an interconnection groove 105 with a T-shaped cross section is formed by a multistep dry etching. FIG. 3(a) shows the state at the end of the step.

Figure 3A:
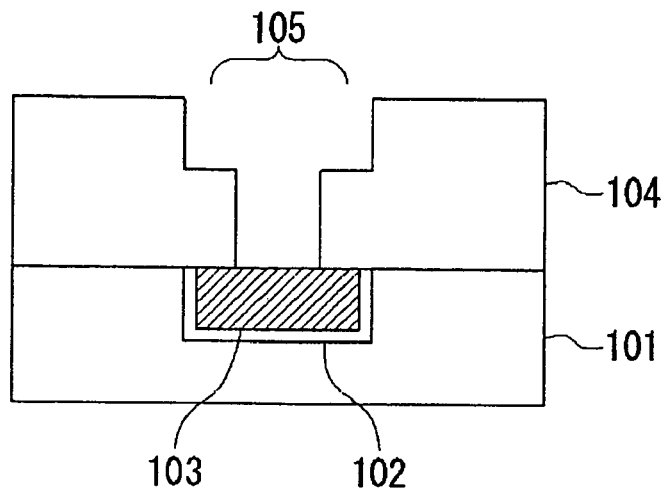
FIGS. 3a-6c are process diagrams illustrating a process for manufacturing an interconnection structure shown in FIG. 1(a).
Figure 3B:
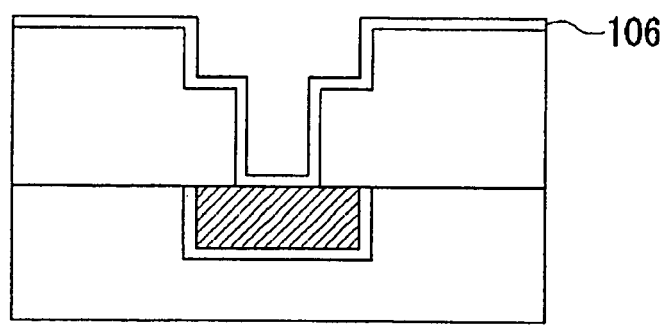

Then, a barrier metal film 106 is formed over the whole surface of the substrate (FIG. 3(b)). A component material of the barrier metal film 106 may contain a high melting metal such as titanium, tungsten and tantalum; for example, titanium titanium nitride, tungsten, tungsten nitride, tantalum and tantalum nitride. It may be a multilayer film in which two or more of these are laminated.

The barrier metal film 106 may be formed by an appropriate process such as sputtering and CVD.

Figure 3C:
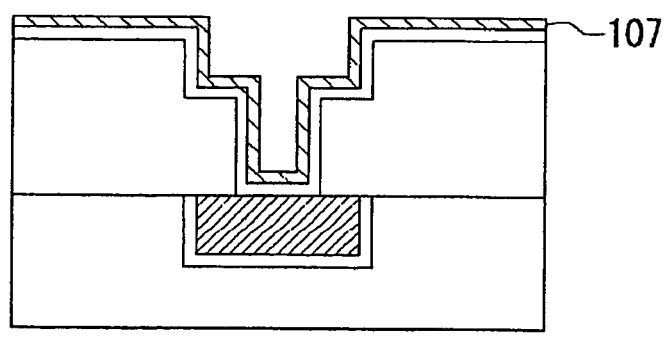

Then, a seed metal film 107 is formed on the barrier metal film 106 (FIG. 3(c)). The seed metal film 107 plays a role as a seed for plating growth in the upper surface and may be made of copper or a copper-silver alloy. The seed metal film 107 may be usually formed by sputtering.

Figure 4A:
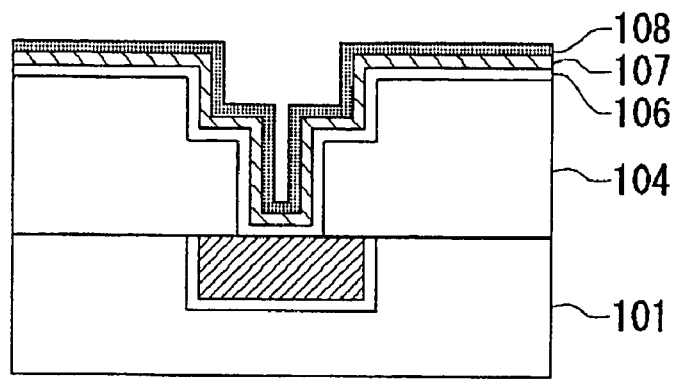

In this state, the substrate surface is contacted with a silver-containing solution to form a silver-containing film 108 on the seed metal film 107 (FIG. 4(a)). Since silver has a lower deposition potential than copper, a silver film is formed as described above. A preferable example of a silver-containing solution is an aqueous solution of silver sulfate. Here, a concentration of the aqueous silver sulfate solution may be 50 ppm by weight to 30 wt % both inclusive. It is particularly desirable that the solution is saturated or supersaturated. Thus, dissolution of copper can be minimized to prevent deformation of the metal region. Such contact with a silver-containing solution deposits silver on the seed metal film 107 to form the silver-containing film 108. Specifically since silver has lower ionization tendency than copper as a component of the seed metal film 107, a redox reaction occurs on the surface of the seed metal film 107, resulting in deposition of silver to form the silver-containing film 108.

Figure 4B:
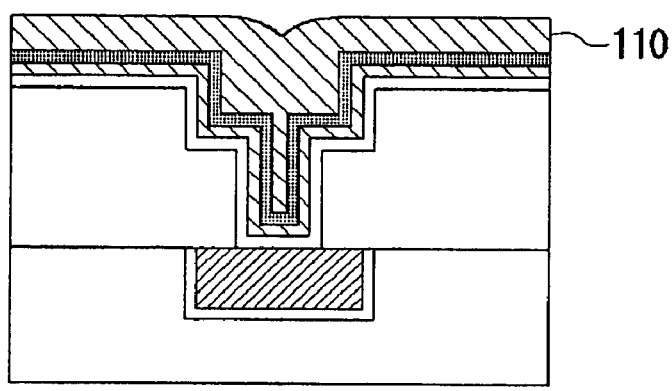

Then, a copper plating film 110 is formed on the substrate surface by plating (FIG. 4(b)). A plating solution may be, but not limited to, an aqueous solution of copper sulfate.

Then, the product is annealed at a temperature within a range of 200° C. to 450° C. The annealing can increase the size of copper grains constituting the copper plating film 110, resulting in stable reduction of a resistance. At the same time, silver is diffused from the silver-containing film 108 to the copper plating film 110 to form a film made of a copper-silver alloy in the interconnection groove.

Figure 4C:
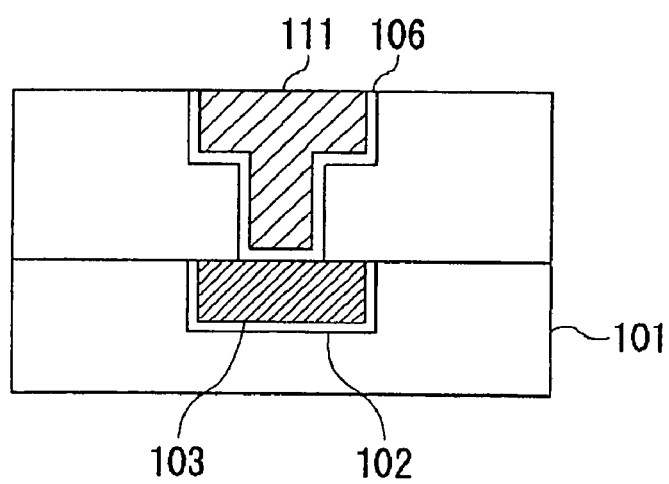

Subsequently, the copper plating film 110 formed outside the interconnection groove is removed by CMP (chemical mechanical polishing) to form an interconnection structure made of a copper-silver alloy (FIG. 4(c)).

According to the process described above, a convenient method can be used to consistently form an interconnection structure made of a copper-silver alloy. Furthermore, since a plating solution itself does not have to contain silver, the plating solution may be selected more freely. For example, the above process may be conducted using a plating solution having good filling properties into a narrow groove or hole to consistently form a silver-containing interconnection with a smaller width.

Embodiment 2

In this embodiment, a silver-containing plating solution is used to form an interconnection structure made as a copper-silver alloy film.

Figure 5A:
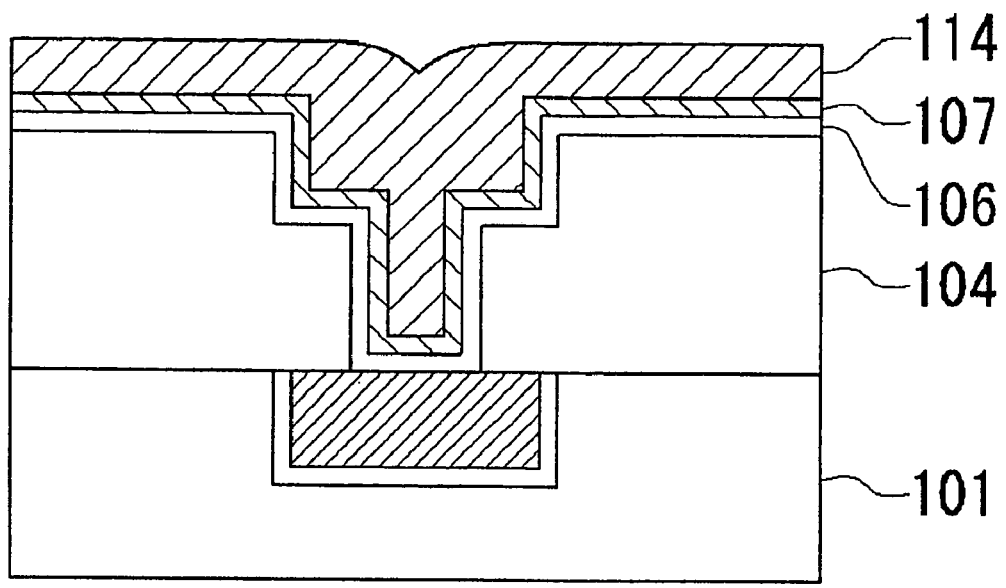
Figure 5B:
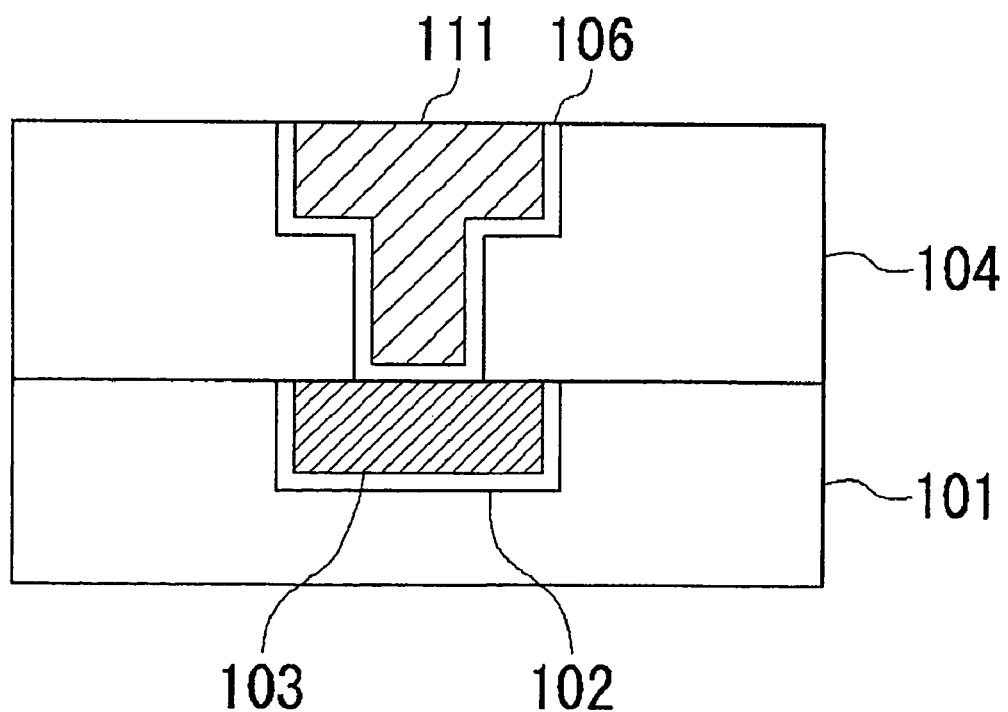

After conducting the steps of FIGS. 3(a) to (c) in embodiment 1, a copper-silver alloy plating film 114 is formed on a seed metal film 107 by plating (FIG. 5(a)). The plating solution used preferably contains copper and silver such that a proportion of silver to copper is 0.1% to 80% by weight.

This plating solution is preferably chloride-ion free. If chloride ions are present in the plating solution, silver is significantly deposited from the plating solution; specifically, deposition occurs before incorporation of silver into the film. An alloy film cannot be, therefore, consistently formed.

Examples of such a plating solution are as follows.

(i) Pyrophosphate Plating Solution

Silver ions can be added to a common copper pyrophosphate plating solution to prepare a pyrophosphate plating solution containing copper and silver. Silver may be added using, for example, a silver nitrate solution, a silver sulfate solution. A specific composition of this plating solution is, for example, Copper: 0.01 to 5 mol/L;
Silver: 0.01 to 5 mol/L;
Pyrophosphoric acid or its salt: 0.01 to 5 mol/L;
Water.

(ii) Ethylenediamine Plating Solution

Silver ions can be added to a common copper ethylenediamine plating solution to prepare an ethylenediamine plating solution containing copper and silver. Silver may be added using, for example, a silver nitrate solution, a silver sulfate solution. A specific composition of this plating solution is, for example, Copper: 0.01 to 5 mol/L;
Silver: 0.01 to 5 mol/L;
Ethylenediamine: 0.01 to 5 mol/L: 0.01 to 5 mol/L;
Water.

Each of these plating solutions may contain one or more additives as appropriate. For example, it can contain a surfactant such as polyethylene glycol, polypropylene glycol, quaternary ammonium salts and gelatin. These additives may equalize a copper crystal size and give a plating film with a uniform thickness. The surfactant may be generally added in an amount of, but not limited to, 1 to 1000 ppm by weight to the total amount of the plating solution.

The plating solution is preferably substantially chloride-free. Specifically, it is preferable that a chloride concentration is 0.01 mg/L or less. Thus, deposition of silver due to a reaction with chloride may be effectively prevented so that a metal film made of a copper-silver alloy may be consistently formed.

Plating conditions may be appropriately determined. They may be, for example, as follows.

Current density: 0.1 to 100 A/dm$^2$;
Solution temperature: 10 to 80° C.

A current applied during plating may be either direct current or pulse current.

After forming a copper-silver alloy plating film 114 as described above, the substrate surface is polished by CMP to form an upper interconnection consisting of a barrier metal film 106 and a copper-silver alloy film 111.

According to this embodiment, a convenient method can be used to consistently form an interconnection structure made of a copper-silver alloy. A metal composition in the interconnection structure may be made uniform.

Embodiment 3

While one plating solution containing copper and silver has been used in embodiment 2, two plating solutions are used in this embodiment.

Figure 6A:
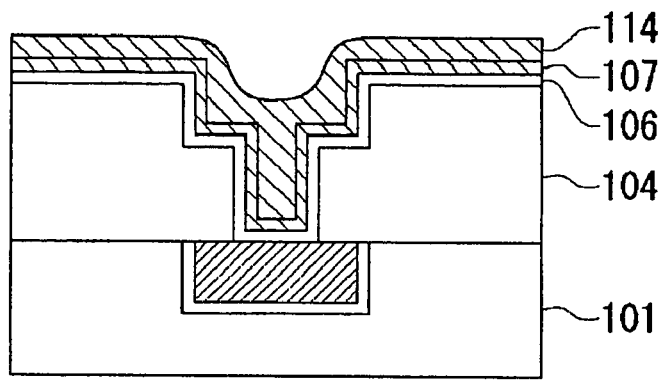

After conducting the steps of FIGS. 3(a) to (c) in embodiment 1, a copper plating film 114 is formed on a seed film 107 by plating (FIG. 6(a)). Here, a plating solution used may be a common copper plating solution, but preferably a chloride-free plating solution. For example, it may be preferably a common copper sulfate plating solution from which chloride ions have been removed, a copper pyrophosphate plating solution or a copper ethylenediamine plating solution. It can prevent silver from reacting with chloride ions in a copper plating film 117 in the subsequent step, to consistently give a metal film made of a copper-silver alloy.

Figure 6B:
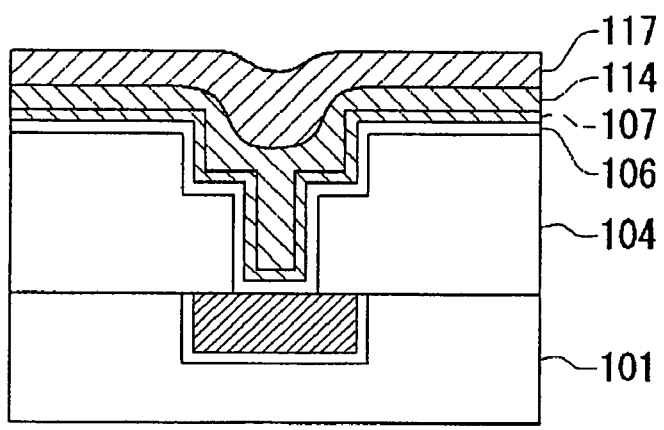

Then, a copper-silver alloy plating film 114 is formed on the copper plating film 117 by plating (FIG. 6(b)). Here, it is preferable to use a chloride-ion free plating solution; specifically, a pyrophosphate plating solution or an ethylenediamine solution described in embodiment 2.

Then, the product is annealed at a temperature within a range of 200° C. to 450° C. By the annealing, silver is diffused from the copper-silver alloy plating film 114 to the copper plating film 117 to form a film made of a copper-silver alloy with a relatively uniform composition in the interconnection groove. Furthermore, the size of metal grains constituting these films can be increased, resulting in stable reduction of a resistance.

Figure 6C:
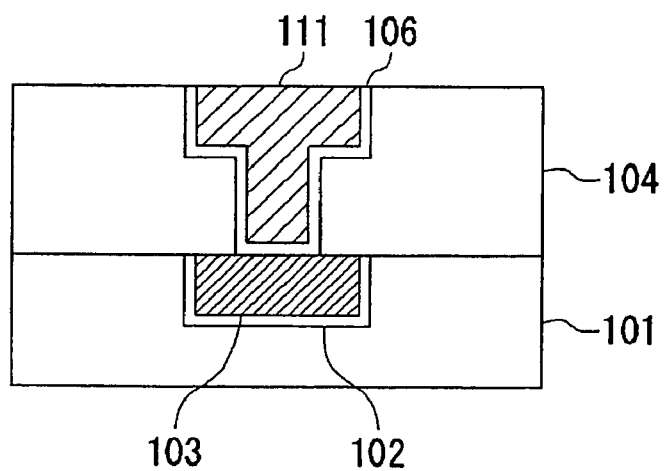

Then, the whole substrate surface is made flat by CMP to form an interconnection structure consisting of the barrier metal film 106 and the copper-silver alloy film 111 (FIG. 6(c)).

According to this embodiment, a convenient method can be used to consistently form an interconnection structure made of a copper-silver alloy. A metal composition in the interconnection structure may be made uniform. In particular, since two plating solutions are used, a plating solution having good filling properties may be used to fill a narrow concave and then a silver-containing plating solution may be used to consistently form a copper-silver alloy film in an interconnection groove with a narrow width and thus to suitably form a reliable interconnection structure.

EXAMPLES

Example 1

Figure 17:
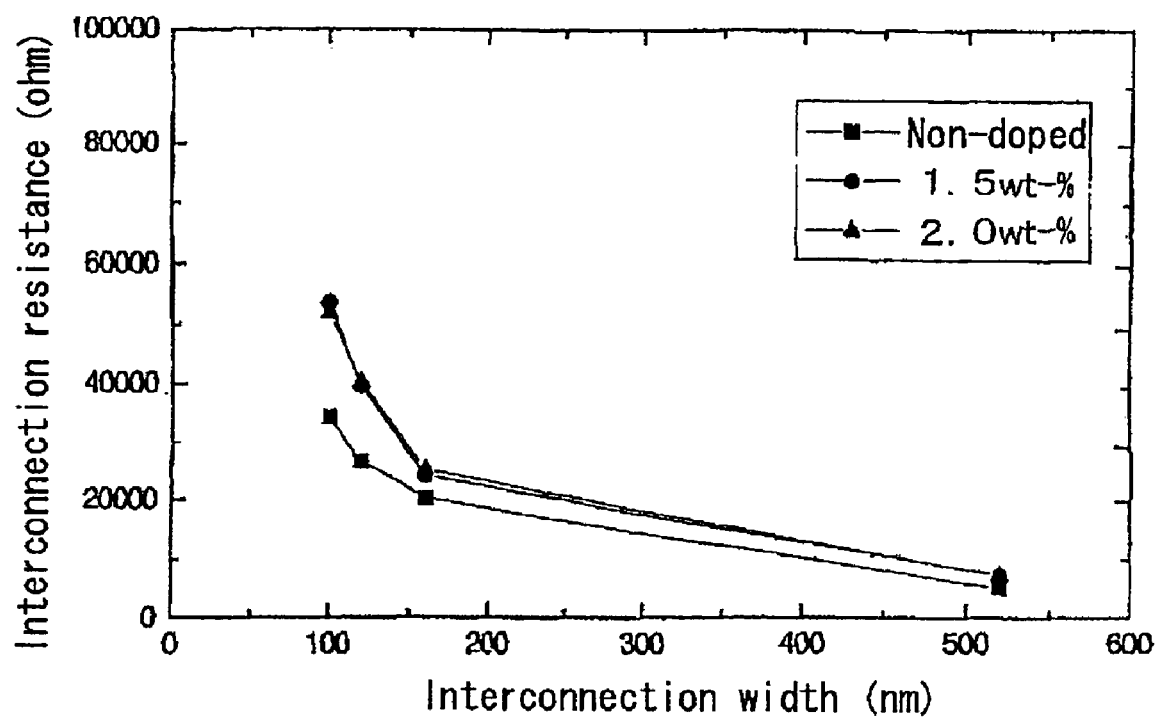
FIG. 17 shows a relationship between a silver content and an interconnection resistance.

Metal interconnections in FIG. 17 were formed by a damascene process. All of these interconnections had dimensions of 0.1 to 0.5 μm (width)×0.3 μm (thickness)×49 mm (length), and silver contents in an interconnection metal were 0, 1.5 and 2.0 wt %. The interconnection was formed by plating using a chloride-ion free plating solution. For the interconnections thus formed, an interconnection resistance was determined and the results shown in FIG. 17 were obtained. This figure shows that resistance increase was inhibited in the interconnection structures in which a silver content to the total amount of the component metals in an interconnection is 1.5 wt % or more. In a copper-silver alloy, a relationship between atom % and wt % is such that, for example, a silver content of 0.9 atom % corresponds to 1.5 wt %.

Example 2

Figure 10:
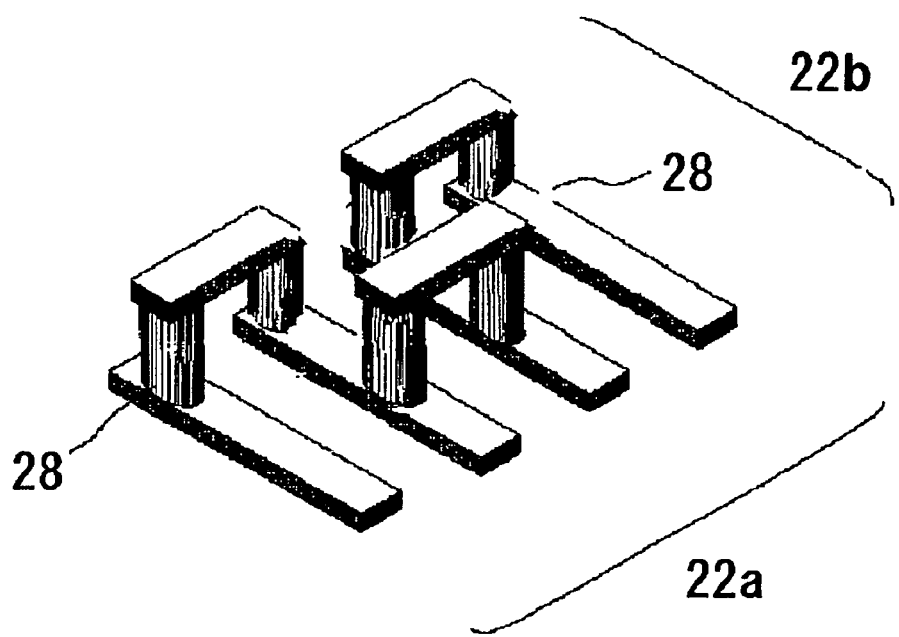
FIG. 10 is a drawing illustrating a principle of determination of a via chain resistance.
Figure 11:
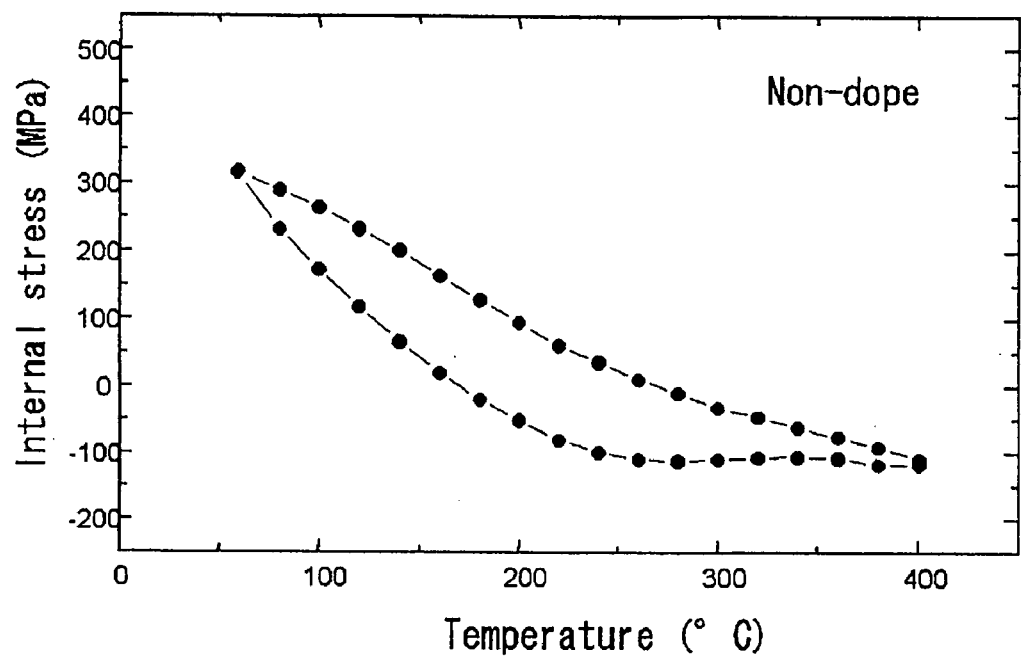
FIGS. 11 to 15 are graphs illustrating exemplary results of determination for a hysteresis curve.
Figure 12:
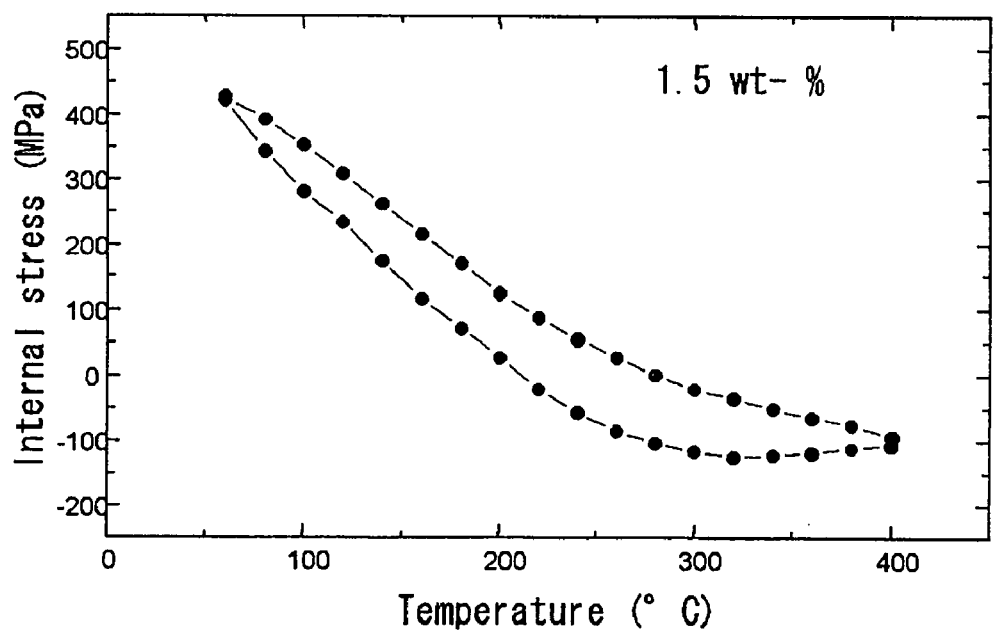
Figure 13:
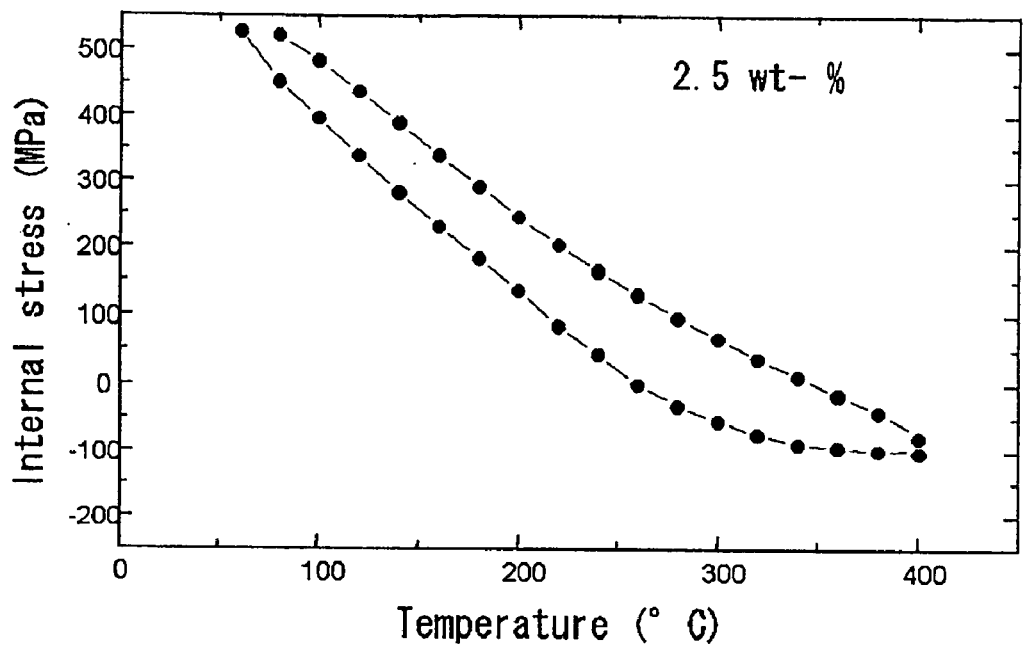
Figure 14:
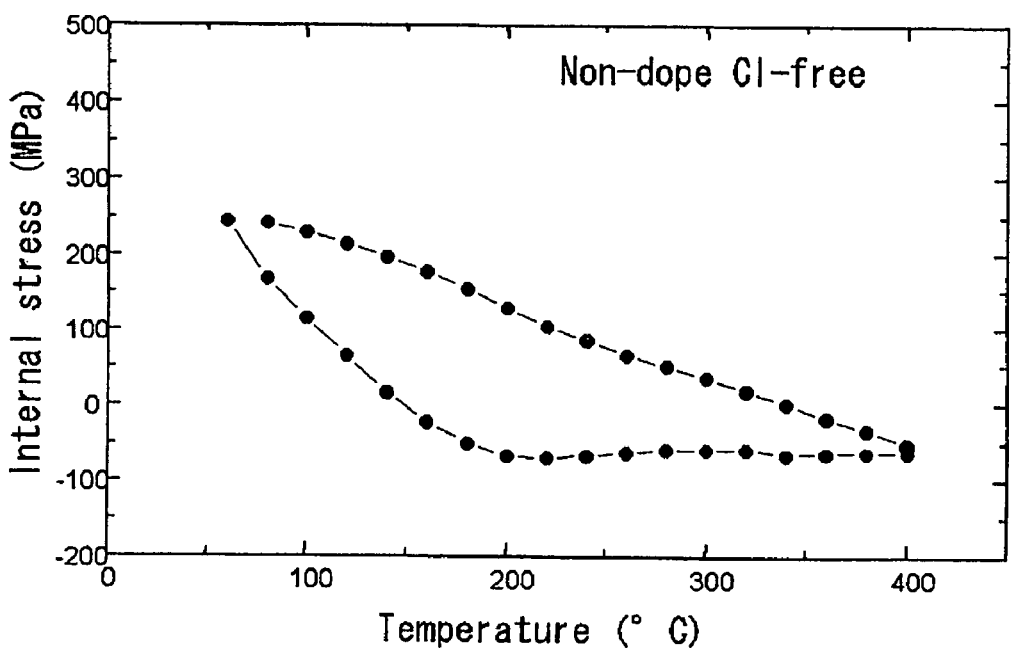
Figure 15:
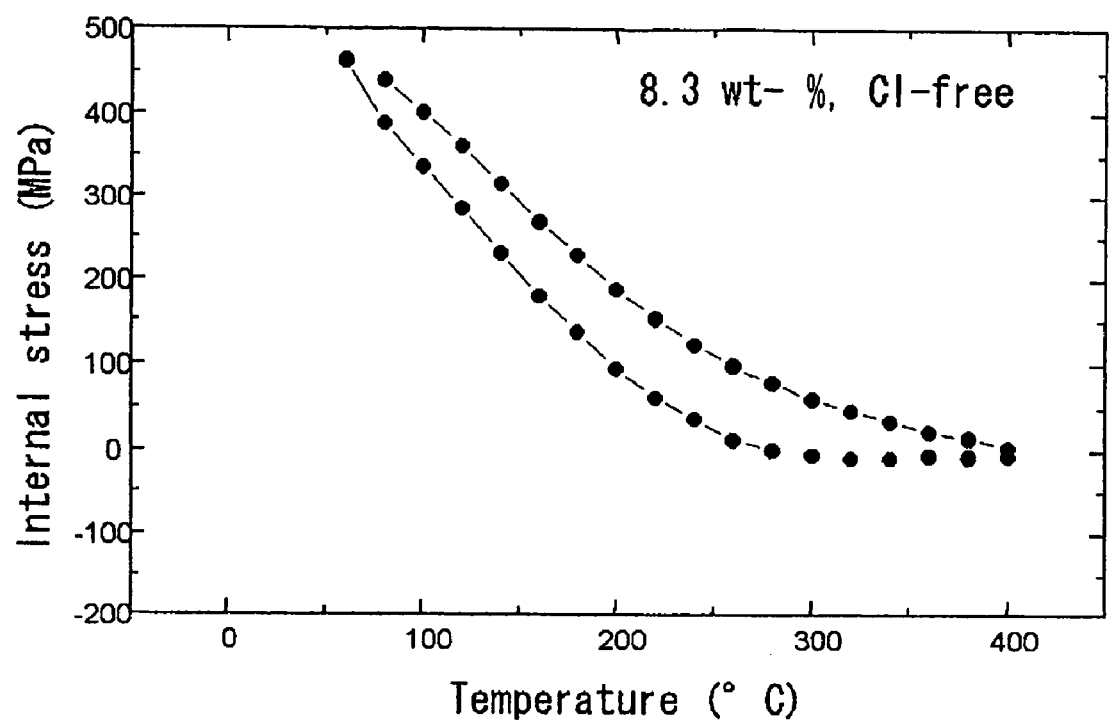

In this example, a two-layer interconnection structure shown in FIG. 10 was formed to test an yield. This two-layer interconnection structure is called a via chain, in which first interconnections 22a are formed in parallel and second interconnections 22b perpendicular to them are formed. The width of the interconnections should be wide such as 5 micron to test the stress-migration reliability effectively. These interconnections are connected to each other via 20,000 connecting plugs 28. In this figure, a semiconductor substrate and an interlayer insulating film are omitted. A given voltage can be applied to the ends of the via chain to measure an electric resistance through 10,000 first interconnections 22a, 10,000 second interconnections 22b and 20,000 connecting plugs 28. The resistance is called a chain resistance, which is an effective indicator to determine the quality of the via connection. While the interconnection structure is placed under given thermal environment, variation in a chain resistance may be determined to suitably evaluate its stress-migration resistance.

TABLE 1

| Sample | Cu/Ag ratio (by weight) | Interconnection forming process | Yield (relative value) |
|---|---|---|---|
| b0 | 100/0 | Plating in a copper sulfate bath | 100 |
| b1 | 100/0 | Plating in a copper sulfate bath | 42 to 60 |
| b2 | 99.95/0.05 | Plating in a silver-containing ethylenediamine bath | 60 to 81 |
| b3 | 98/2 | Plating in a silver-containing ethylenediamine bath | 88 to 100 |

After preparing the samples, they are left at 150° C. for 500 hours and are then subject to an yield test. As a reference, a via chain yield was determined for a two-layer interconnection structure prepared as described above which was left at room temperature for 500 hours (b0).

Table 1 shows relative resistances for samples b1 to b3 when a resistance for the reference sample b0 is 100%. In this table, a resistance is described as a range from the results obtained by evaluating a plurality of the samples prepared. A higher value indicates higher stress-migration resistance.

From the results in this example, stress migration can be effectively prevented by using an interconnection structure made of a silver-copper alloy, particularly an interconnection structure in which a silver content to the total amount of component metals in the interconnection is more than 1 wt %.

Example 3

For evaluating material properties for the samples in Examples 1 and 2, hysteresis properties and recrystallization temperatures were determined.

Samples were prepared as follows. On a silicon substrate was deposited a silicon oxide film to 500 nm by plasma CVD, on which was then deposited a Ta film to 50 nm. Then, on the upper surface was deposited a copper plating seed film to 100 to 200 nm by sputtering, on which was then deposited a copper or copper-silver alloy film to 600 to 700 nm using a given plating solution. A composition of the copper or copper-silver alloy film was described in Table 2, in which plating solution 1 contains chloride ions while plating solution 2 does not.

The samples thus prepared were exposed to thermal cycles of 25° C. to 400° C. In this heat history, a warming rate was 10° C./min in the warming process while a cooling rate was about 10° C./min in the cooling cycle. The thermal cycle was repeated twice and hysteresis properties were evaluated during the second cycle because it was thought to be proper to evaluate hysteresis properties during the second thermal cycle for exactly determining hysteresis properties in the light of the fact that during the first thermal cycle, grains constituting the film grow and that it is important to evaluate stability under practical working conditions or under heating during a process. A recrystallization temperature was also determined during the second thermal cycle.

Hysteresis properties were evaluated by calculating an internal stress in a plating film from a measured bending of a substrate. A substrate bending was calculated by determining a reflection angle of an irradiated laser beam on the substrate surface. A maximum hysteresis error and a recrystallization temperature were determined from the hysteresis properties thus obtained (a temperature-stress curve during the second thermal cycle). The results are shown in Table 2. Hysteresis curves for some samples are shown in FIGS. 11 to 15, where samples c1, c2, c4, c5 and c6 correspond to FIGS. 11, 14, 12, 13 and 15, respectively.

TABLE 2

| Sample | Cu/Ag composition ratio (by weight) | Intrconnection forming process | Maximum hysteresis error (MPa) | Recrystallization temperature (° C.) |
|---|---|---|---|---|
| c1 | 100/0 | Plating in a copper sulfate bath | 210 | 150 |
| c2 | 100/0 | Plating in an ethylenediamine bath | 160 | 170 |
| c3 | 99/1 | Plating in a silver-containing ethylenediamine bath (Plating solution 1) | 150 | 190 |
| c4 | 98.5/1.5 | Plating in a silver-containing ethylenediamine bath (Plating solution 1) | 120 | 220 |
| c5 | 97.5/2.5 | Plating in a silver-containing ethylenediamine bath (Plating solution 1) | 100 | 250 |
| c6 | 91.7/8.3 | Plating in a silver-containing ethylenediamine bath (Plating solution 2) | 80 | 240 |

As understood from the above results, when a silver content to the total amount of component metals in an interconnection is more than 1 wt %, a recrystallization temperature is increased and a maximum hysteresis error is significantly reduced. Good properties of b3 in Example 2 may be obtained because of such improvement in hysteresis properties.

As described above, according to this invention, a reliable semiconductor device having good properties such as stress-migration resistance can be provided because a metal region such as an interconnection structure is made of (i) a metal containing silver at a particular amount, (ii) a metal whose maximum hysteresis error in a temperature-stress curve for a metal region is within a particular range, or (iii) a metal whose recrystallization temperature is within a particular range.

What is claimed is:

1. A semiconductor device comprising a semiconductor substrate having a metal region, wherein the metal region comprises an alloy containing copper and silver and has a silver content equal to more than 1 wt % of the total amount of component metals in the metal region.

2. A semiconductor device comprising a semiconductor substrate having a metal region, wherein the metal region comprises an alloy containing copper and silver; and a silver content to the total amount of component metals in the metal region is more than a solid solution limit of silver to copper.

3. A semiconductor device comprising a semiconductor substrate having a metal region comprising an alloy containing copper and silver, wherein a maximum hysteresis error in a temperature-stress curve in the metal region is 150 MPa or less.

4. A semiconductor device comprising a semiconductor substrate having a metal region comprising an alloy containing copper and silver, wherein a recrystallization temperature of a component metal of the metal region is 200 ° C. or higher.

5. The semiconductor device as claimed in claim 1, wherein the metal region has a silver content equal to more than 90% of the total amount of component metals in the metal region.

6. The semiconductor device as claimed in claim 1, wherein the metal region has a silver content equal to more than 95% of the total amount of component metals in the metal region.

7. The semiconductor device as claimed in claim 1, wherein the metal region is an interconnection, plug or pad.

8. The semiconductor device as claimed in claim 2, wherein the metal region is an interconnection, plug or pad.

9. The semiconductor device as claimed in claim 3, wherein the metal region is an interconnection, plug or pad.

10. The semiconductor device as claimed in claim 4, wherein the metal region is an interconnection, plug or pad.

11. A semiconductor device comprising a semiconductor substrate having a metal region, wherein the metal region comprises a silver-containing homogeneous metal alloy of copper and silver having a silver content equal to more than 1 wt % of the total amount of component metals in the metal region.

12. A semiconductor device comprising a semiconductor substrate having a metal region, wherein the metal region comprises a homogenous alloy of copper and silver; and a silver content to the total amount of component metals in the metal region is more than a solid solution limit of silver to copper.

13. The semiconductor device as claimed in claim 11, wherein the metal region is an interconnection, plug or pad.

14. The semiconductor device as claimed in claim 12, wherein the metal region is an interconnection, plug or pad.

15. The semiconductor device as claimed in claim 11, wherein said metal region further includes at least one metal selected from the group consisting of Zn, In, Al, Ti and Sn.

16. The semiconductor device as claimed in claim 12, wherein said metal region further includes at least one metal selected from the group consisting of Zn, In, Al, Ti and Sn.

* * * * *